United States Patent
Na

(10) Patent No.: US 7,778,095 B2
(45) Date of Patent: Aug. 17, 2010

(54) SEMICONDUCTOR MEMORY DEVICE AND METHOD FOR DRIVING THE SAME

(75) Inventor: Kwang-Jin Na, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 235 days.

(21) Appl. No.: 12/000,698

(22) Filed: Dec. 17, 2007

(65) Prior Publication Data

US 2008/0239845 A1 Oct. 2, 2008

(30) Foreign Application Priority Data

Mar. 29, 2007 (KR) .................... 10-2007-0030772

(51) Int. Cl.
*G11C 7/00* (2006.01)

(52) U.S. Cl. ............... 365/194; 365/233.1; 365/189.07; 365/189.05

(58) Field of Classification Search ................. 365/194, 365/233.1, 189.07, 189.05; 327/158, 276, 327/278
See application file for complete search history.

(56) References Cited

U.S. PATENT DOCUMENTS

| | | | |
|---|---|---|---|
| 6,859,404 B1 * | 2/2005 | Kim | ........................... 365/194 |
| 6,943,602 B1 | 9/2005 | Lee | |
| 6,985,401 B2 | 1/2006 | Jang et al. | |
| 6,987,408 B2 | 1/2006 | Kim | |
| 6,995,591 B2 | 2/2006 | Lee | |
| 7,038,972 B2 * | 5/2006 | Seo et al. | ............... 365/233.11 |
| 7,103,133 B2 | 9/2006 | Jung | |
| 2005/0195663 A1 | 9/2005 | Kwak | |

FOREIGN PATENT DOCUMENTS

| | | |
|---|---|---|
| JP | 2003-045183 | 2/2003 |
| JP | 2004-104747 | 4/2004 |
| JP | 2005-251368 | 9/2005 |
| JP | 2005-332548 | 12/2005 |
| KR | 1020030002131 A | 1/2003 |
| KR | 10-2004-0078471 A | 9/2004 |
| KR | 10-2005-0041677 A | 5/2005 |
| KR | 100832023 B1 | 5/2008 |

OTHER PUBLICATIONS

Korean Office Action, with English Translation, issued in Korean Patent Application No. KR 10-2007-0030772, dated on Mar. 25, 2008.
Notice of Allowance issued from Korean Intellectual Property Office on Jun. 16, 2009 with an English Translation.

* cited by examiner

*Primary Examiner*—David Lam
(74) *Attorney, Agent, or Firm*—IP & T Law Firm PLC

(57) ABSTRACT

A semiconductor memory device includes a delay locked loop (DLL) unit configured to generate a plurality of DLL clocks, each having a different phase according to delay values predefined by a DLL operation; a data output buffering unit configured to output data in response to the DLL clocks; and a skew compensating unit disposed between the DLL unit and the data output buffering unit to remove a clock skew occurring when the DLL clocks are transferred to the data output buffering unit.

24 Claims, 4 Drawing Sheets

SEMICONDUCTOR MEMORY DEVICE AND METHOD FOR DRIVING THE SAME

CROSS-REFERENCE TO RELATED APPLICATIONS

The present invention claims priority of Korean patent application number 10-2007-0030772, filed on Mar. 29, 2007, which is incorporated by reference in its entirety.

BACKGROUND OF THE INVENTION

The present invention relates to a semiconductor memory device, and more particularly, to a delay locked loop (DLL) circuit of a semiconductor memory device.

A system is implemented with a variety of semiconductor devices. One of them is a semiconductor memory device used as a data storage. The semiconductor memory device outputs data corresponding to addresses received from a data processor, e.g., a central processing unit (CPU), or stores data received from the data processor into unit cells selected by addresses inputted together with the data.

As the operating speed of the system increases, the data processor requires the semiconductor memory device to input/output data at higher speed. As semiconductor integrated circuit (IC) technologies rapidly develop, the operating speed of the data processor increases, but the data input/output speed of the semiconductor memory device does not keep up with the increased operating speed of the data processor.

Many attempts have been made to develop semiconductor memory devices that can increase data input/output speed up to the level required by the data processor. One of these semiconductor memory devices is a synchronous memory device that outputs data at each period of a system clock. Specifically, the synchronous memory device outputs or receives data to or from the data processor in synchronization with the system clock. However, because even the synchronous memory device could not keep up with the operating speed of the data processor, a double data rate (DDR) synchronous memory device was developed. The DDR synchronous memory device outputs or receives data at each transition of the system clock. That is, the DDR synchronous memory device outputs or receives data in synchronization with falling edges and rising edges of the system clock.

However, a system clock inevitably has a delay time until it arrives at a data output circuit because it passes through a clock input buffer, a clock transmission line, etc. Thus, if the data output circuit outputs data in synchronization with the delayed system clock, an external device will receive data that are not synchronized with rising edges and falling edges of the system clock.

To solve this problem, the semiconductor memory device uses a delay locked loop (DLL) circuit to lock a delay of a clock signal. The DLL circuit compensates for the delay caused by internal circuits of the semiconductor memory device until the system clock inputted to the semiconductor memory device is transferred to the data output circuit. The DLL circuit finds the delay time of the system clock, which is caused by the clock input buffer, the clock transmission line, etc. of the semiconductor memory device. Then, the DLL circuit delays the system clock by the found delay time and outputs the delayed system clock to the data output circuit. That is, the DLL circuit outputs a delayed-locked clock (DLL clock) to the data output circuit. The data output circuit outputs data in synchronization with the DLL clock. Therefore, the data are correctly outputted to the external circuit in synchronization with the system clock.

In an actual operation, the DLL clock is transferred to the output buffer at a time point earlier by one period than a time point when the data must be outputted, and the output buffer outputs data in synchronization with the received DLL clock. Therefore, the data is outputted faster than the delay of the system clock caused by the internal circuit of the semiconductor memory device. In this way, the data are correctly outputted in synchronization with the rising and falling edges of the system clock inputted to the semiconductor memory device. That is, the DLL circuit is a circuit to find how fast the data must be outputted in order to compensate for the delay of the system clock within the semiconductor memory device.

Recently, a DLL circuit is designed to generate DLL clocks with different phases. As the data I/O speed becomes faster, the DLL circuit generates DLL clocks with different phases in order to maximumly secure a timing necessary to process a plurality of data. A data I/O circuit aligns data using the DLL clocks with different phases. AT this point, a delay skew occurs between the DLL clocks. When data are outputted at a high speed, even a small delay skew will cause a serious data I/O error.

SUMMARY OF THE INVENTION

Embodiments of the present invention are directed to providing a semiconductor memory device having a DLL circuit, which can easily compensate for a clock skew between different DLL clocks.

In accordance with a first aspect of the present invention, there is provided a semiconductor memory device, including: a delay locked loop (DLL) unit configured to generate a plurality of DLL clocks, each having a different phase according to delay values predefined by a DLL operation; a data output buffering unit configured to output data in response to the DLL clocks; and a skew compensating unit disposed between the DLL unit and the data output buffering unit to remove a clock skew occurring when the DLL clocks are transferred to the data output buffering unit.

In accordance with a second aspect of the present invention, there is provided a method for driving a semiconductor memory device, including: generating a plurality of DLL clocks, each having a different phase according to delay values predefined by a delay locked loop (DLL) operation of a DLL; compensating for a clock skew occurring when the DLL clocks are transferred to a data output buffer; and outputting data from the data output buffer in response to the compensated DLL clocks.

In accordance with a third aspect of the present invention, there is provided a delay locked loop (DLL), including: a phase comparator configured to compare a phase of a reference clock with a phase of a feedback clock; a delay chain configured to delay the reference clock to output a plurality of delayed clocks, each having a different phase; a delay controller configured to control delay values of the delay chain according to the comparison result of the phase comparator; a clock skew compensator configured to compensate for a clock skew occurring when the delayed clocks from the delay chain are transferred to a data output buffer; and a replica model configured to delay an output of the clock skew compensator according to a modeling value to output the feedback clock.

In accordance with a fourth aspect of the present invention, there is provided a method for driving a delay locked loop (DLL), including: comparing a phase of a reference clock with a phase of a feedback clock; delaying the reference clock for delay values to output a plurality of delayed clocks having different phases; controlling the delay values in response to the phase comparison result; compensating for a clock skew occurring when the delayed clocks are transferred to a data output buffer; and generating the feedback clock by delaying the compensated delayed clock according to a modeling value.

DESCRIPTION OF SPECIFIC EMBODIMENTS

Hereinafter, a semiconductor memory device and a method for driving the same in accordance with the present invention will be described in detail with reference to the accompanying drawings.

Figure 1:
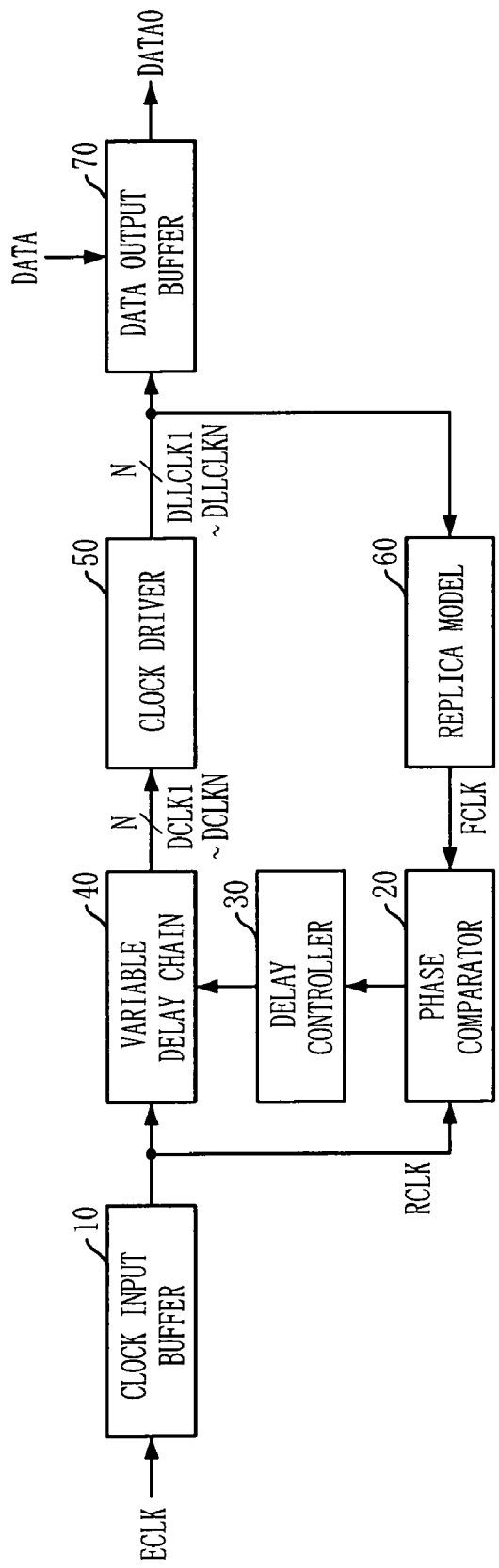
FIG. 1 is a block diagram of a semiconductor memory device.

FIG. 1 is a block diagram of a semiconductor memory device having a DLL circuit.

Referring to FIG. 1, the semiconductor memory device includes a clock input buffer 10, a phase comparator 20, a delay controller 30, a variable delay chain 40, a clock driver 50, a replica model 60, and a data output buffer 70.

The clock input buffer 10 buffers a system clock ECLK to output a reference clock RCLK. The phase comparator 20 compares a phase of the reference clock RCLK with that of a feedback clock FCLK and outputs a comparison result to the delay controller 30. The delay controller 30 controls a delay value of the reference clock RCLK in the variable delay chain 40 according to the comparison result of the phase comparator 40. The variable delay chain 40 is implemented with a plurality of unit delays. The variable delay chain 40 delays the reference clock RCLK by a predetermined amount under control of the delay controller 30 and outputs a plurality of delayed clocks DCLK1 to DCLKN. During this operation, the variable delay chain 40 receives the reference clock RCLK to output the plurality of delayed clocks DCLK1 to DCLKN, each having a different phase. Delay values of the delayed clocks DCLK1 to DCLKN are different from one another and are controlled by the delayed controller 30. The clock driver 50 outputs a plurality of DLL clocks DLLCLK1 to DLLCLKN based on the delayed clocks DCLK1 to DCLKN outputted from the variable delay chain 40. The clock driver 50 is a circuit for enhancing a driving capability that makes the DLL clocks DLLCLK1 to DLLCLKN transferred to respective circuits of the semiconductor memory device at predefined timings. The replica model 60 delays the DLL clocks DLLCLK1 to DLLCLKN for a delay time until the system clock inputted to the semiconductor memory device is transferred to a data I/O circuit. The data output buffer 70 outputs internal data DATA as output data DATA0 in response to the DLL clocks DLLCLK1 to DLLCLKN.

A DLL operation of the semiconductor memory device will be described below with reference to FIG. 1. The phase comparator 20 compares the phase of the reference clock RCLK outputted from the clock input buffer 10 with that of the feedback clock FCLK outputted from the replica model 60. The delay controller 30 controls the delay value of the reference clock RCLK of the variable delay chain 40 according to the comparison result of the phase comparator 20. This operation is performed until the phase of the reference clock RCLK inputted to the phase comparator 20 is equal to that of the feedback clock FCLK. When the phase of the reference clock RCLK inputted to the phase comparator 20 becomes equal to that of the feedback clock FCLK, the delay value of the delayed clocks DCLK1 to DCLKN from the variable delay chain 40 is fixed. The clock driver 50 enhances the driving capability of the delayed clocks DCLK1 to DCLKN and outputs the DLL clocks DLLCLK1 to DLLCLKN.

The DLL clocks DLLCLK1 to DLLCLKN finally outputted from the clock driver 50 are transferred to the data output buffer 70. In this operation, the DLL clocks DLLCLK1 to DLLCLKN are transferred to the data output buffer 70 at different timings. At this point, a clock skew occurs at the DLL clocks DLLCLK1 to DLLCLKN according to the transfer paths or environments. When the semiconductor memory device inputs or outputs data at high speed, the clock skew may cause an error in the data processing timing of the semiconductor memory device. The present invention provides a semiconductor memory device that can remove the clock skew in the DLL.

Figure 2:
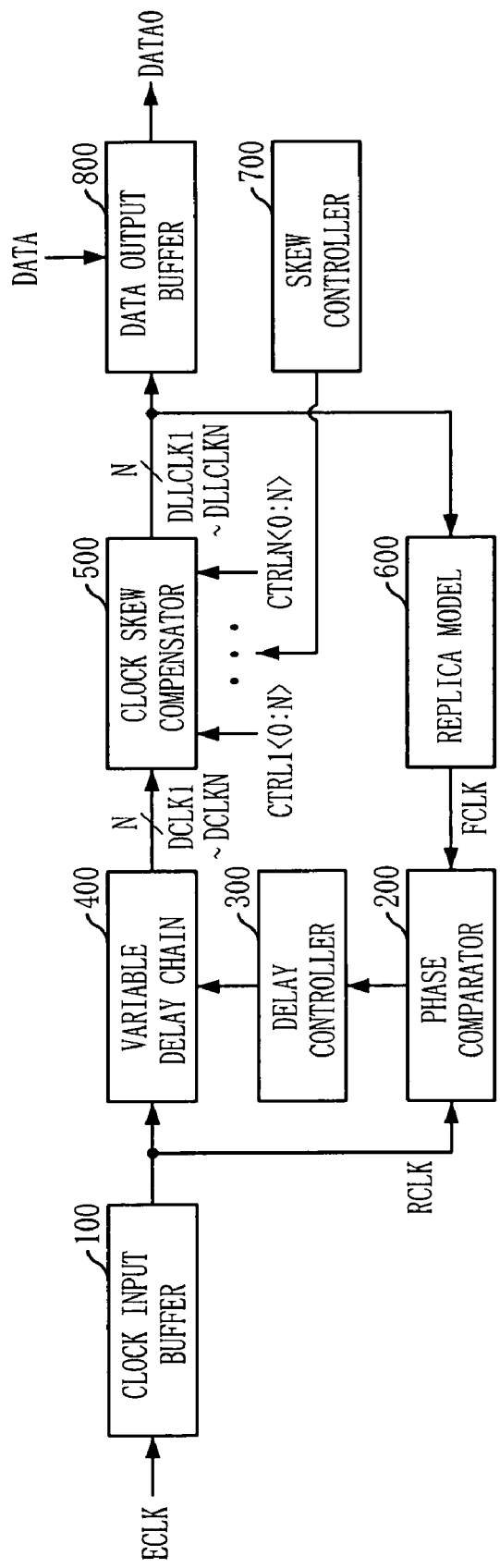
FIG. 2 is a block diagram of a semiconductor memory device in accordance with an embodiment of the present invention.

FIG. 2 is a block diagram of a semiconductor memory device in accordance with an embodiment of the present invention.

Referring to FIG. 2, the semiconductor memory device includes a clock input buffer 100, a phase comparator 200, a delay controller 300, a variable delay chain 400, a clock skew compensator 500, a replica model 600, a skew controller 700, and a data output buffer 800.

The semiconductor memory device of FIG. 2 differs from the semiconductor memory device of FIG. 1 in that it further includes the clock skew compensator 500 and the skew controller 700. The clock skew compensator 500 and the skew controller 700 compensate for a clock skew occurring when a plurality of delayed clocks DCLK1 to DCLKN from the variable delay chain 400 are transferred to the data output buffer 800. Therefore, a plurality of DLL clocks DLLCLK1 to DLLCLKN from the clock skew compensator 500 can be inputted to the data output buffer 800 at predefined timings. The data output buffer 800 can output internal data DATA as output data DATA0 to the outside at predefined timings.

More specifically, the skew controller 700 generates a plurality of control signals CTRL1<0:N> to CTRLN<0:N> for removing the clock skew of the DLL clocks DLLCLK1 to DLLCLKN inputted to the data output buffer 800. The skew controller 700 can generate the control signals CRTL1<0:N> to CTRLN<0:N> in various methods. For example, the skew controller 700 can generate the control signals CRTL1<0:N> to CTRLN<0:N> by selectively blowing a plurality of fuses. The skew controller 700 can generate the control signals CRTL1<0:N> to CTRLN<0:N> by decoding external control signals. Further, the skew controller 700 can generate the control signals CRTL1<0:N> to CTRLN<0:N> during a normal operation mode in which the semiconductor memory device accesses data. The skew controller 700 can generate the control signals CRTL1<0:N> to CTRLN<0:N> so as to test the clock skew occurring in the DLL clocks DLLCLK1 to DLLCLKN inputted to the data output buffer 800 in a test mode.

The clock skew compensator 500 includes a plurality of unit skew compensators for the delayed clocks DCLK1 to DCLKN. The respective unit skew compensator receives a corresponding one of the delayed clocks DCLK1 to DCLKN, e.g., CTRL1<0:N>, among the control signals CRTL1<0:N> to CTRLN<0:N>.

Figure 3:
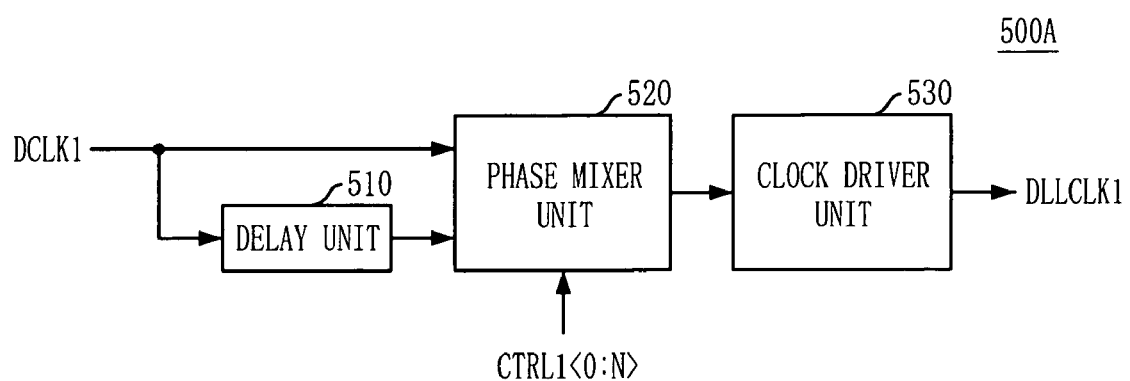
FIG. 3 is a block diagram of a unit skew compensator included in a clock skew compensator illustrated in FIG. 2.

FIG. 3 is a block diagram of the unit skew compensator included in the clock skew compensator 500 illustrated in FIG. 2.

Referring to FIG. 3, the unit skew compensator 500A includes a delay unit 510, a phase mixer unit 520, and a clock driver unit 530. The delay unit 510 delays the corresponding delayed clock DCLK1 by a predefined delay value. The phase mixer unit 520 mixes a phase of an output of the delay unit 510 and a phase of the clock DCLK1. The clock driver unit 530 enhances a driving capability of a clock outputted from the phase mixer unit 520.

Figure 4:
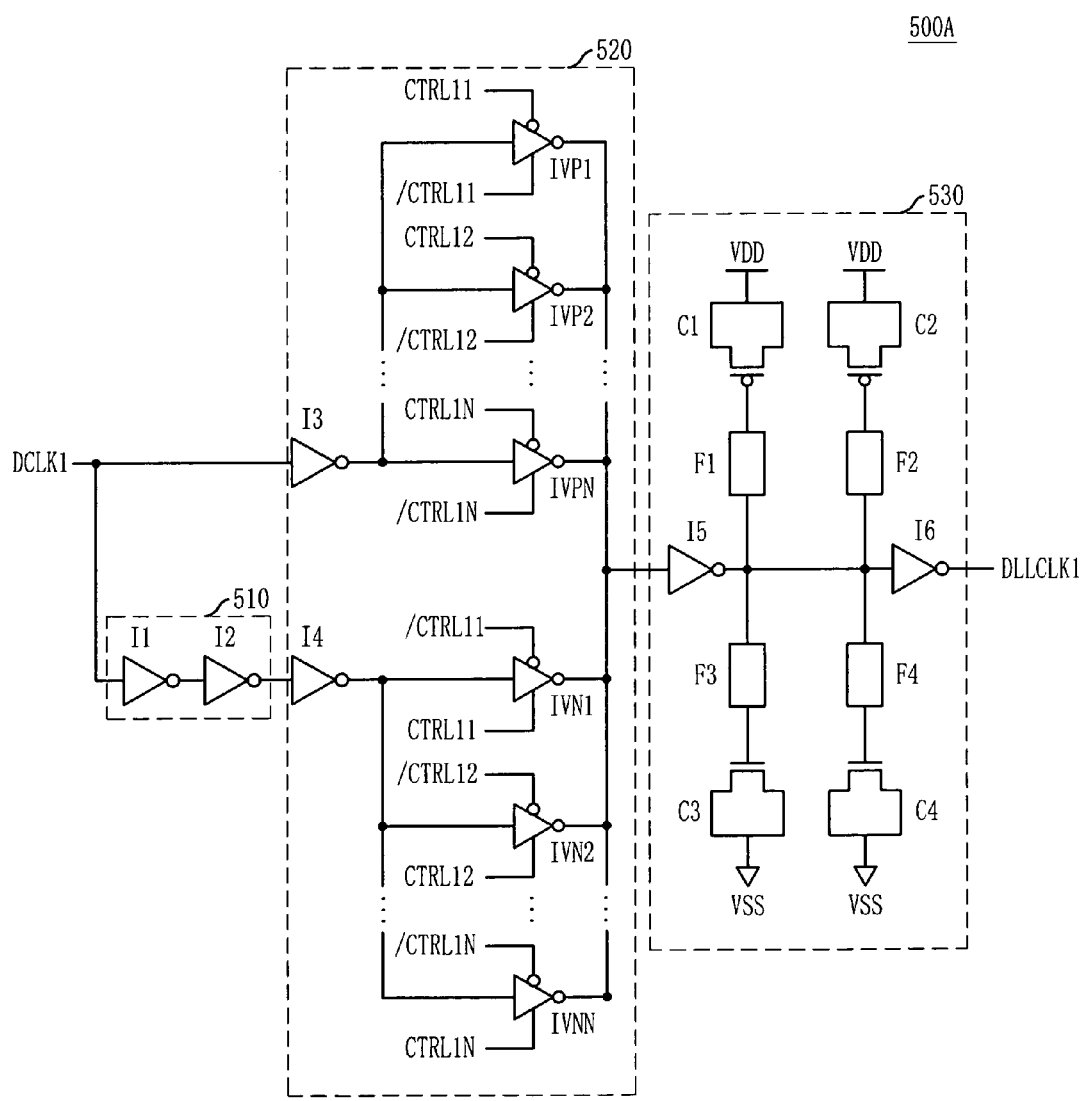
FIG. 4 is a circuit diagram of a clock skew compensator illustrated in FIG. 3.

FIG. 4 is a circuit diagram of the unit skew compensator illustrated in FIG. 3.

Referring to FIG. 4, the delay unit 510 includes first and second inverters I1 and I2. The first and second inverters I1 and I2 delay the corresponding delayed clock DCLK1 by the predefined delay value.

The phase mixer unit 520 includes third and fourth inverters I3 and I4, a plurality of first 3-state inverters IVP1 to IVPN, and a plurality of second 3-state inverters IVN1 to IVNN. The third inverter I3 inverts the corresponding delayed clock DCLK1. The first 3-state inverters IVP1 to IVPN are arranged in parallel and are enabled in response to the control signals CTRL1 to CTRLN and /CTRL1 to /CTRLN to transfer an output of the third inverter I3 to the clock driver unit 530. The fourth inverter I4 inverts the output of the delay unit 510. The second 3-state inverters IVN1 to IVNN are arranged in parallel and are enabled in response to the control signals CTRL1 to CTRLN and /CTRL1 to /CTRLN to transfer an output of the fourth inverter to the clock driver unit 530. Although the 3-state inverters IVP1 to IVPN and IVN1 to IVNN are used herein, the phase mixer unit 520 can also be implemented using a buffer.

The phase mixer unit 520 mixes the phase of the clock outputted from the delay unit 510 and the phase of the corresponding delayed clock DCLK1 according to the control signals CTRL1 to CTRLN and /CRTL1 to /CTRLN. When the number of the first 3-state inverters IVP1 to IVPN which are enabled is more than that of the second 3-state inverters IVN1 to IVNN, the phase mixer unit 520 generates a clock having a phase mixed toward the phase of the delayed clock DCLK1. When the number of the first 3-state inverters IVP1 to IVPN which are enabled is less than that of the second 3-state inverters IVN1 to IVNN, the phase mixer unit 520 generates a clock having a phase mixed toward the phase of the clock outputted from the delay unit 510.

The clock driver unit 530 includes fifth and sixth inverters I5 and I6, first to fourth capacitors C1 to C4, and first to fourth fuses F1 to F4. The first to fourth capacitors C1 to C4 control an output timing and the driving capability of the delayed clock DLLCLK1. The output timing and the driving capability are controlled by selectively blowing the first to fourth fuses F1 to F4.

In the semiconductor memory device in accordance with the embodiment of the present invention, the DLL circuit generates the DLL clocks in which clock skew occurring when the DLL clocks are transferred to the data output buffer 800 is compensated for. Thus, the DLL clocks can be inputted to the data output buffer at the predefined timings. That is, the clock skew between the DLL clocks is removed. Since the data output buffer also processes data using the clocks whose skew is removed, it can process data at an improved operation margin. Further, since the data output buffer outputs data to an external circuit by using the clocks whose skew is adjusted, the semiconductor memory device can output data at the most optimal timing.

In accordance with the embodiments of the present invention, the operation margin for data processing can be improved because the clock skew between the clocks inputted to the data output buffer is removed. Moreover, the semiconductor memory device can output data to an external circuit at the most optimal timing specified in the specification.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
    a delay locked loop (DLL) unit configured to generate a plurality of DLL clocks, each having a different phase according to delay values predefined by a DLL operation;
    a data output buffering unit configured to output data in response to compensated DLL clocks; and
    a skew compensating unit disposed between the DLL unit and the data output buffering unit and configured to delay each of the DLL clocks and mix each of the DLL clocks with a corresponding one of the delayed DLL clocks to produce the compensated DLL clocks.

2. The semiconductor memory device as recited in claim 1, wherein the DLL unit includes:
    a phase comparator for comparing a phase of a reference clock with a phase of a feedback clock;
    a delay chain for delaying the reference clock to output the plurality of DLL clocks having different phases; and
    a delay controller for controlling delay values of the delay chain in response to the comparison result of the phase comparator.

3. The semiconductor memory device as recited in claim 1, wherein the skew compensation unit includes a plurality of unit skew compensators corresponding to the DLL clocks, each of the unit skew compensators including:
    a delay unit for delaying a corresponding one of the DLL clocks by a predefined delay value; and
    a phase mixing unit for mixing a phase of an output of the delay unit and a phase of the corresponding DLL clock in response to first and second control signals.

4. The semiconductor memory device as recited in claim 3, wherein the unit skew compensators further includes a clock driving unit configured to enhance a driving capability of a clock outputted from the phase mixing unit.

5. The semiconductor memory device as recited in claim 3, wherein the phase mixing unit includes:
    a plurality of first buffers arranged in parallel and enabled in response to the first control signal to transfer the corresponding DLL clock; and
    a plurality of second buffers arranged in parallel and enabled in response to the second control signal to transfer the output of the delay unit.

6. The semiconductor memory device as recited in claim 3, further comprising a skew controlling unit configured to control the skew compensating unit to remove the clock skew by generating the first and second control signals.

7. The semiconductor memory device as recited in claim 6, wherein the skew controlling unit generates the first and second control signals by selectively blowing a plurality of fuses.

8. The semiconductor memory device as recited in claim 6, wherein the skew controlling unit generates the first and second control signals during a normal operation mode in which the semiconductor memory device accesses data.

9. The semiconductor memory device as recited in claim 6, wherein the skew controlling unit generates the first and second control signals so as to test the clock skew in a test mode.

10. A method for driving a semiconductor memory device, comprising:
   generating a plurality of DLL clocks, each having a different phase according to delay values predefined by a delay locked loop (DLL) operation of a DLL;
   compensating for a clock skew by delaying each of DLL clocks and mixing each of the DLL clocks with a corresponding of the delayed DLL clocks; and
   outputting data from the data output buffer in response to the compensated DLL clocks.

11. The method as recited in claim 10, wherein the generating of the plurality of DLL clocks includes:
   comparing a phase of a reference clock with a phase of a feedback clock;
   delaying the reference clock for delay values to output the plurality of DLL clocks having different phases; and
   controlling the delay values in response to the comparison result.

12. The method as recited in claim 10, wherein the compensating of the clock skew includes:
   delaying a corresponding one of the DLL clocks by a predefined delay value; and
   mixing a phase of the delayed clock and a phase of the corresponding DLL clock in response to first and second control signals.

13. The method as recited in claim 12, wherein the compensating of the clock skew further includes generating the first and second control signals by selectively blowing a plurality of fuses.

14. The method as recited in claim 12, wherein the compensating of the clock skew further includes generating the first and second control signals during a normal operation mode in which the semiconductor memory device accesses data.

15. The method as recited in claim 12, wherein the compensating of the clock skew further includes generating the first and second control signals so as to test the clock skew in a test mode.

16. A delay locked loop (DLL), comprising:
   a phase comparator configured to compare a phase of a reference clock with a phase of a feedback clock;
   a delay chain configured to delay the reference clock to output a plurality of delayed clocks, each having a different phase;
   a delay controller configured to control delay values of the delay chain according to the comparison result of the phase comparator;
   a clock skew compensator configured to compensate for a clock skew; and
   a replica model configured to delay an output of the clock skew compensator according to a modeling value to output the feedback clock.

17. The DLL as recited in claim 16, wherein the clock skew compensator includes a plurality of unit skew compensator corresponding to the delayed clocks, each of the unit skew controllers including:
   a delay unit for delaying a corresponding one of the delayed clocks by a predefined delay value; and
   a phase mixing unit for mixing a phase of an output of the delay unit and a phase of the corresponding delayed clock in response to first and second control signals.

18. The DLL as recited in claim 17, wherein the phase mixing unit includes:
   a plurality of first buffers arranged in parallel and enabled in response to the first control signal to transfer the corresponding delayed clock; and
   a plurality of second buffers arranged in parallel and enabled in response to the second control signal to transfer the output of the delay unit.

19. The DLL as recited in claim 17, further comprising a skew controller configured to control the skew compensating unit to remove the clock skew by generating the first and second control signals.

20. The DLL as recited in claim 19, wherein the skew controller generates the first and second control signals by selectively blowing a plurality of fuses.

21. The DLL as recited in claim 19, wherein the skew controller generates the first and second control signals during a normal operation mode in which the semiconductor memory device accesses data.

22. The DLL as recited in claim 19, wherein the skew controller generates the first and second control signals so as to test the clock skew in a test mode.

23. A method for driving a delay locked loop (DLL), comprising:
   comparing a phase of a reference clock with a phase of a feedback clock;
   delaying the reference clock for delay values to output a plurality of delayed clocks having different phases;
   controlling the delay values in response to the phase comparison result;
   compensating for a clock skew; and
   generating the feedback clock by delaying the compensated delayed clock according to a modeling value.

24. The method as recited in claim 23, wherein the compensating of the clock skew includes:
   delaying a corresponding one of the delayed clocks by a predefined delay value; and
   mixing a phase of the delayed result clock and a phase of the corresponding delayed clock in response to first and second control signals.

* * * * *